United States Patent
Moore et al.

(10) Patent No.: US 6,559,054 B2
(45) Date of Patent: May 6, 2003

(54) METHODS OF TREATING SURFACES OF SUBSTRATES

(75) Inventors: Scott E. Moore, Meridian, ID (US); Trung Tri Doan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 72 days.

(21) Appl. No.: 09/863,607

(22) Filed: May 22, 2001

(65) Prior Publication Data

US 2001/0026998 A1 Oct. 4, 2001

Related U.S. Application Data

(62) Division of application No. 09/389,290, filed on Sep. 2, 1999.

(51) Int. Cl.$^7$ ...................... H01L 21/302; H01L 21/461
(52) U.S. Cl. ...................... 438/691; 438/693; 438/906; 438/959; 134/5; 134/902
(58) Field of Search ................... 438/690–693, 438/906, 959, 963, 974; 134/5, 902

(56) References Cited

U.S. PATENT DOCUMENTS

| | | | | |
|---|---|---|---|---|
| 5,013,693 A | * | 5/1991 | Guckel et al. | 216/2 |
| 5,651,834 A | | 7/1997 | Jon et al. | |
| 5,931,721 A | | 8/1999 | Rose et al. | |
| 5,976,264 A | | 11/1999 | McCullough et al. | |
| 6,012,968 A | * | 1/2000 | Lofaro | 451/39 |
| 6,220,935 B1 | * | 4/2001 | Furusawa et al. | 134/2 |
| 6,277,753 B1 | | 8/2001 | Mullee et al. | |

FOREIGN PATENT DOCUMENTS

| | | | | |
|---|---|---|---|---|
| JP | 2-305440 | | 12/1990 | |
| JP | 3-206617 | | 9/1991 | |
| JP | 4-079326 | | 3/1992 | |
| JP | 04365550 A | * | 12/1992 | B24B/29/02 |
| JP | 6-163497 | | 6/1994 | |
| JP | 06302583 A | * | 10/1994 | H01L/21/306 |
| JP | 7-201795 | | 8/1995 | |
| JP | 9-36075 | | 2/1997 | |
| JP | 09036075 A | * | 2/1997 | H01L/21/304 |
| JP | 9-219384 | | 8/1997 | |
| JP | 9-275086 | | 10/1997 | |

OTHER PUBLICATIONS

Cold Jet, Inc. (web page articles from www.coldjet.com Mar. 25, 1999), 2 pgs.
Cryokinetics (web page articles from www.cryokinetics.com Mar. 25, 1999), 2 pgs.
$CO_2$ Snow (web page articles from clean.rti.org Mar. 25, 1990), 2 pgs.
TechniClean (web page articles from www.techniclean.com Mar. 25, 1999), 3 pgs.
Cleaning Methods (web page articles from depalmamfg.com Mar. 25, 1999), 4 pgs.

* cited by examiner

*Primary Examiner*—Amir Zarabian
*Assistant Examiner*—Jamie L. Brophy
(74) *Attorney, Agent, or Firm*—Wells St. John P.S.

(57) ABSTRACT

In one aspect, the invention includes a method of treating a surface of a substrate. A mixture which comprises at least a frozen first material and liquid second material is provided on the surface and moved relative to the substrate. In another aspect, the invention encompasses a method of treating a plurality of substrates. A treating member is provided proximate a first substrate, and an initial layer of frozen material is formed over a surface of the treating member. A surface of the first substrate is treated by moving at least one of the treating member and the first substrate relative to the other of the treating member and the first substrate. After the surface of the first substrate is treated, the initial layer of frozen material is removed from over the surface of the treating member. The treating member is then provided proximate another substrate, and the surface of the other substrate is treated by moving at least one of the treating member and the second substrate relative to the other of the treating member and the second substrate.

13 Claims, 4 Drawing Sheets

METHODS OF TREATING SURFACES OF SUBSTRATES

RELATED PATENT DATA

This patent resulted from a divisional application of U.S. patent application Ser. No. 09/389,290, which was filed Sep. 2, 1999.

TECHNICAL FIELD

The invention pertains to methods of treating surfaces of substrates, such as, for example, methods of polishing and cleaning substrate surfaces. In particular aspects, the invention pertains to methods of polishing and/or cleaning surfaces of semiconductive mater wafers.

BACKGROUND OF THE INVENTION

It is frequently desired to treat substrate surfaces during fabrication of semiconductive material wafers. Exemplary processes include procedures whereby surfaces of semiconductor substrates are cleaned and/or polished. To aid in interpretation of the claims that follow, the terms "semiconductor substrate" and "semiconductive substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. An exemplary semiconductive substrate is a wafer of monocrystalline silicon.

Among the methods of polishing a semiconductor material surface is chemical-mechanical polishing. Chemical-mechanical polishing is accomplished by providing a slurry of liquid and solid particulates over a wafer and mechanically abrading the wafer surface with the slurry. (The liquid can comprise, for example, an aqueous solution having ammonium ions therein, and the solid particulates can comprise, for example, silicon slurry particulates and/or cesium slurry particulates.) The mechanical abrasion can be accomplished by providing a polishing pad above the wafer surface and spinning one or both of the wafer and the pad to cause the wafer surface to be moved relative to the polishing pad. A problem that can occur during polishing of a wafer surface is in removal of the particulates from over the surface at the termination of the polishing process. Particulates that are not removed from over the wafer can cause damage to electrical devices formed over the wafer.

Several procedures have been developed to assist in cleaning particulates from a wafer surface. Among the procedures is to flush a liquid over the wafer surface while mechanically agitating the liquid with a cleaning member. Such cleaning member can comprise, for example, a brush or a polishing pad. The agitation of the liquid can help to dislodge particles from the wafer surface. Another method which has been utilized to clean a wafer surface is to project solid particles against the wafer surface. In one application, solid particles of carbon dioxide ($CO_2$) are ejected against a semiconductive material surface to dislodge particles from the surface. An advantage of utilizing solid $CO_2$ is that the material can be sublimed from the semiconductive material surface to enable easy removal of the material.

It would be desirable to develop alternative methods for cleaning and/or polishing substrates. It would be particularly desirable to develop alternative methods for polishing and/or cleaning semiconductive material substrates, such as, for example, monocrystalline silicon wafers.

SUMMARY OF THE INVENTION

In one aspect, the invention includes a method of treating a surface of a substrate. A mixture which comprises at least a frozen first material and a liquid second material is provided on the surface and moved relative to the substrate.

In another aspect, the invention encompasses a method of treating a plurality of substrates. A treating member is provided proximate a first substrate, and an initial layer of frozen material is formed over a surface of the treating member. A surface of the first substrate is treated by moving at least one of the treating member and the first substrate relative to the other of the treating member and the first substrate. After the surface of the first substrate is treated, the initial layer of frozen material is removed from over the surface of the treating member. The treating member is then provided proximate another substrate, and the surface of the other substrate is treated by moving at least one of the treating member and the second substrate relative to the other of the treating member and the second substrate.

In yet another aspect, the invention encompasses a method of treating a surface of a semiconductive material wafer. A treating member having a substantially planar surface is provided, and a layer of frozen material is formed over the substantially planar surface. A surface of a semiconductive material wafer is contacted with the layer of frozen material, and at least one of the treating member and the wafer is removed relative to the other of the treating member and the wafer.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention encompasses methods of treating substrate surfaces with frozen solids. In particular embodiments, the invention encompasses methods of cleaning and/or polishing semiconductive material wafer surfaces, such as, for example, methods of cleaning and/or polishing monocrystalline silicon wafer surfaces. Several different aspects of the invention are described below with reference to FIGS. 1–8. In one aspect, a substrate is cleaned and/or polished by freezing a liquid to a surface of a treating device (such as, for example, a roller or platen) and contacting the substrate to be cleaned or polished with the frozen liquid while applying a mechanical action. After the substrate has been processed, the frozen liquid is mechanically removed, melted or vaporized. A new layer of frozen material can then be reapplied to the treating device prior to processing another substrate with the treating device. In another aspect, a substrate is sprayed or rinsed with a mixture comprising a frozen material and a liquid (of the course the mixture can comprise materials other than the frozen material and the liquid, such as, for example, silicon slurry particles, ammonium ions, and/or cesium slurry particles). In yet another aspect, a substrate is submerged within a mixture comprising a frozen material and a liquid, and agitated therein. In yet another aspect, the invention encompasses a method of cleaning and/or polishing wherein frozen particles are injected into a cold fluid stream which is subsequently flowed directly onto a substrate.

As will become apparent from the embodiments discussed below, several aspects of the invention comprise changing materials from one state of matter to another, such as, for example, from a solid state of matter to a liquid state of matter. Such phase changes can be accomplished by subjecting the materials to one or both of a change in temperature or a change in pressure.

Figure 1:
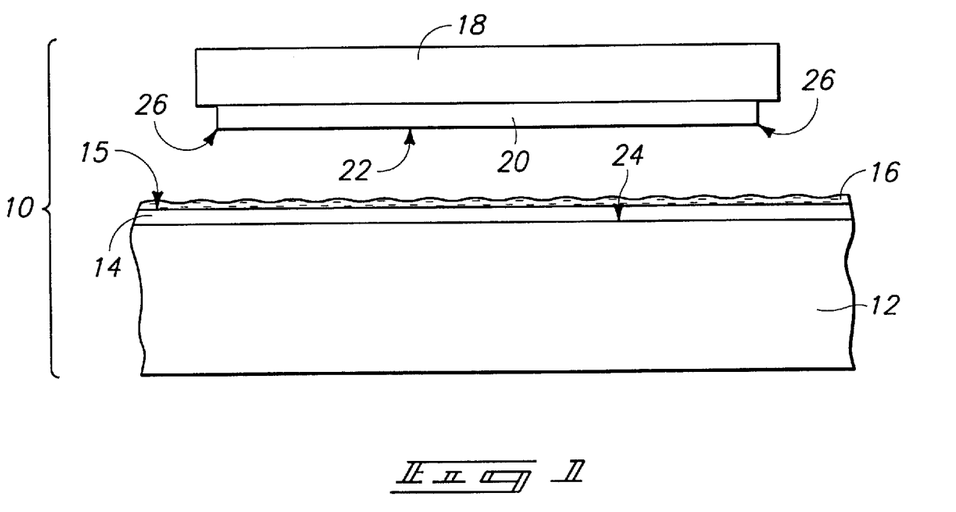
FIG. 1 is a diagrammatic view of a substrate surface treatment apparatus encompassed by the present invention.

A first aspect of the invention is described with reference to FIG. 1, which illustrates a first embodiment cleaning apparatus 10. Apparatus 10 comprises a platen 12 having a layer 14 of frozen material formed thereon. Layer 14 can comprise, for example, $CO_2$, or $H_2O$, and can be formed by spraying a liquid onto a cooled platen 12. Specifically, platen 12 can be cooled to below a freezing temperature of the material of layer 14, and layer 14 can be applied to platen 12 as a liquid which subsequently freezes to form the frozen layer 14 over platen 12. An upper surface 15 of layer 14 is referred to as a "treating" surface, as such will be utilized to treat a substrate surface.

In the shown embodiment, a liquid layer 16 is formed on treating surface 15, and accordingly over frozen material layer 14. Liquid layer 16 can comprise the material of layer 14, or can comprise a different material. Liquid layer 16 can result from surface melting of layer 14, or can be formed by applying a liquid over layer 14. In particular embodiments, layer 16 will comprise a liquid with a lower freezing temperature than the material of layer 14 such that the material of layer 16 remains a liquid at temperatures which freeze the material of layer 14. For instance, layer 16 can comprise glycol in embodiments wherein layer 14 comprises $H_2O$.

Apparatus 10 further comprises a carrier 18 configured to receive and support a substrate. A substrate 20 is shown supported by carrier 18. Substrate 20 can comprise, for example, a semiconductive material wafer, such as, for example, a wafer of monocrystalline silicon. In operation, substrate 20 is lowered to contact one or both of frozen layer 14 and liquid layer 16. Subsequently, at least one of platen 12 and substrate 20 is moved relative to the other of platen 12 and substrate 20 to cause layer 14 to move relative to a surface 22 of substrate 20.

In the shown embodiment, cleaning member 12 comprises a substantially planar surface 24 upon which frozen material layer 14 is formed. Also in the shown embodiment, surface 22 of substrate 20 is substantially planar. Surface 22 has a peripheral edge 26 extending around it. In particular applications, substrate 20 is a wafer having a circular shape. In such embodiments, periphery 26 also comprises a circular shape. In the exemplary shown embodiment, planar surface 24 of cleaning member 12 extends outwardly beyond peripheral 26 on all sides of surface 22 of substrate 20. Such enables an entirety of surface 22 to be uniformly polished when wafer 20 is brought into contact with frozen layer 14 and moved relative to frozen layer 14.

Platen 12 can be referred to as a cleaning member. In particular embodiments of the invention, cleaning member 12 can be replaced with other devices besides a platen, such as, for example, a roller.

It is noted that liquid layer 16 is optional in methods of the present invention, but can provide an advantage in removing contaminants from over frozen surface 14. Specifically, treating member 12 and frozen layer 14 can together be considered a mechanical treating device which imparts energy to surface 22 of substrate 20. The rigidity of structures 12 and 14 enables such structures to impart significant energy to surface 22, but such rigid structures are poor for carrying contaminants away. Liquid 16, however, has preferred qualities for removing contaminants from between surface 22 and layer 14. Accordingly, in a preferred application of the present invention, treating member 12 and frozen layer 14 are utilized to impart energy to surface 22, and fluid 16 is flowed across surface 14 to continuously remove contaminants from between layer 14 and surface 22.

The method described above with reference to FIG. 1 treats surface 22, and can be utilized, for example, to polish surface 22 and/or to clean particulates from surface 22.

After surface 22 has been treated, substrate 20 can be removed from apparatus 10, and replaced with another substrate which is to be treated. In particular embodiments, treating surface 15 is cleaned prior to providing another substrate within apparatus 10. Such cleaning can remove contaminants from treating surface 15, and accordingly alleviate cross contamination between different wafers treated within apparatus 10. The utilization of frozen material 14 can simplify cleaning of treating surface 15. Specifically, material 14 can be simply melted and removed from over surface 24 of treating member 12 by, for example, flushing melted material 14 off from surface 12. The melted material 14 will carry with it contaminants that had been associated with surface 15. Subsequently, a new layer 14 can be frozen on top of treating member 12, to form a new, clean, and substantially planar treating surface 15. The melted material of layer 14 can be subjected to a purification process, such as, for example, filtration or distillation, and subsequently reutilized to form a frozen layer over cleaning member 12.

Of course other methods, besides melting, can be utilized to remove at least a portion of frozen material 14 from over treating member 12. Such other methods include, for example, mechanically removing material of surface 15 from over member 12, by, for example, scraping or chipping. In particular embodiments, only a thin portion of frozen material 14 comprising surface 15 is removed, and the remaining portion of frozen material 14 is utilized in cleaning a subsequent wafer substrate.

Figure 2:
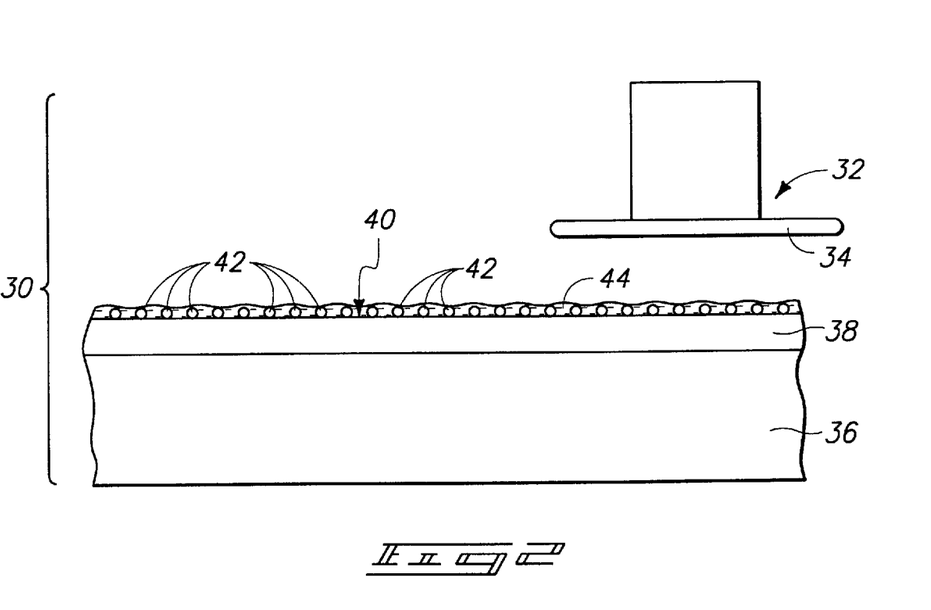
FIG. 2 is a diagrammatic view of another embodiment substrate surface treatment apparatus of the present invention.

Another embodiment of the invention is described with reference to FIG. 2. FIG. 2 illustrates an apparatus 30 configured for treating a surface. Apparatus 30 comprises a treating member 32 which, in the shown embodiment, comprises a polishing pad 34. It is to be understood, however, that treating member 32 can comprise other forms, such as, for example, a brush.

Apparatus 30 further comprises a substrate holder 36, which in the shown embodiment is holding a substrate 38. Substrate 38 can comprise, for example, a semiconductive material wafer, such as, for example, a monocrystalline silicon wafer. Substrate 38 comprises a surface 40 which is to be treated. The treatment can comprise, for example, polishing and/or cleaning of surface 40. A mixture of frozen first material 42, and liquid second material 44 is provided on surface 40 of substrate 38. The first material of frozen first material 42 and the second material of liquid, material 44 can comprise the same material. In aspects in which the frozen material and liquid material comprise the same material, the mixture of materials 42 and 44 can be referred to as a slurry. In one aspect, the frozen material and liquid material can both comprise $CO_2$. In another aspect, the frozen material and liquid material can both comprise $H_2O$. In further aspects, the frozen material and liquid material can both consist essentially of $CO_2$, or $H_2O$.

Liquid material 44 can also differ from solid material 42. In aspects in which the frozen material and liquid material comprise the different materials, the mixture of materials 42 and 44 can be referred to as a suspension. In such other aspects, the liquid material 44 can comprise a lower freezing point than the solid material 42. For instance, solid material 42 can comprise $H_2O$, and liquid material 44 can comprise glycol. Alternatively, liquid material 44 can comprise a higher freezing point than solid material 42. For instance, liquid material 44 can comprise $H_2O$ and solid material 42 can comprise $CO_2$.

In embodiments in which liquid material 44 and solid material 42 comprise the same material, the mixture of solid material 42 and liquid material 44 can be formed by providing a liquid consisting essentially of such material, and cooling the liquid to about a freezing point temperature of the material. At such temperature, there will be an equilibrium between a liquid form of the material and a solid form of the material.

In embodiments in which the material of liquid 44 differs from the material of solid 42, and in which the material of solid 42 has a higher freezing point than the material of liquid 44, the mixture of solid material 42 and liquid material 44 can be formed by, for example, forming and cooling a liquid blend of the materials that are ultimately to be incorporated into solid 42 and liquid 44. Specifically, the liquid blend is cooled to a temperature between the freezing point of the material of solid 42 and the freezing point of the material of liquid 44. At such temperature, solid 42 will form, and the material of liquid 44 will remain liquid. In an exemplary embodiment, the liquid blend will comprise a blend of liquid $H_2O$ and glycol, and the mixture of solid 42 and liquid 44 will be formed by cooling the blend to a temperature below the freezing point of water (0° C.) and above the freezing point of glycol.

Liquid 44 and frozen solid 42 are provided between substrate 38 and treating member 34. Subsequently, member 34 is utilized to move the mixture of materials 44 and 42 relative to surface 40 of substrate 38. Such moving can be accomplished by moving one or both of substrate 38 and cleaning member 32. The movement of materials 44 and 42 relative to surface 40 can cause cleaning and/or polishing of surface 40. For instance, pad 34 can be utilized to push the mixture of solids 42 and liquid 44 along surface 40. Solids 42 can be utilized to impart mechanical energy to surface 40 for dislodging contaminants from the surface, or, in particular applications, for polishing the surface, and liquid 44 can be utilized for flushing the dislodged contaminants away from surface 40.

After the mixture of liquid 44 and solids 42 has been moved relative to surface 40, such mixture can be removed from the surface. The mixture can be removed by flushing the mixture off from surface 40 with additional liquid 44. During or after removal of the mixture from surface 40, solids 42 can be melted or sublimed to convert the frozen material from a solid state of matter to another state of matter (i.e., to a gas if the solid is sublimed, and to a liquid if the solid is melted). If the solid is melted, a liquid will be formed comprising materials of solids 42 and liquid 44. Such liquid can be a blend if solids 42 comprised a different material than that of liquid 44, or can comprise a single material if solids 42 and liquid 44 comprised common materials. In any event, the liquid formed after melting solids 42 can be subjected to a purification process, such as, for example, filtration or distillation. The liquid can then be subjected to conditions which reform the frozen solids 42 within liquid 44. Such conditions can comprise, for example, cooling the liquid to a temperature which causes the material of solids 42 to freeze. After solids 42 are reformed within liquid 44, the mixture of solids 42 and liquid 44 can be re-utilized to clean and/or polish substrate surfaces.

Figure 3:
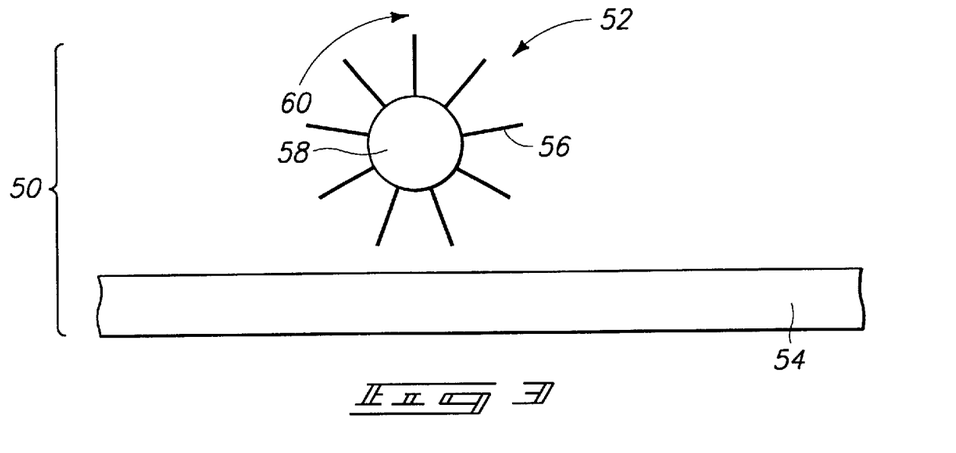
FIG. 3 is a diagrammatic view of yet another embodiment surface treatment apparatus of the present invention, shown at a preliminary step prior to providing a substrate proximate the apparatus.

Another embodiment of the invention is described with reference to FIGS. 3–5. Referring to FIG. 3, an apparatus 50 comprises a substrate treating member 52 and a substrate holder 54. Substrate cleaning member 52 is shown in the form of a brush, and comprises bristles 56 extending from a rotatable member 58. Rotatable member 58 is configured to rotate in a direction indicated by arrow 60 and to accordingly spin bristles 56 relative to a substrate held within holder 54.

Figure 4:
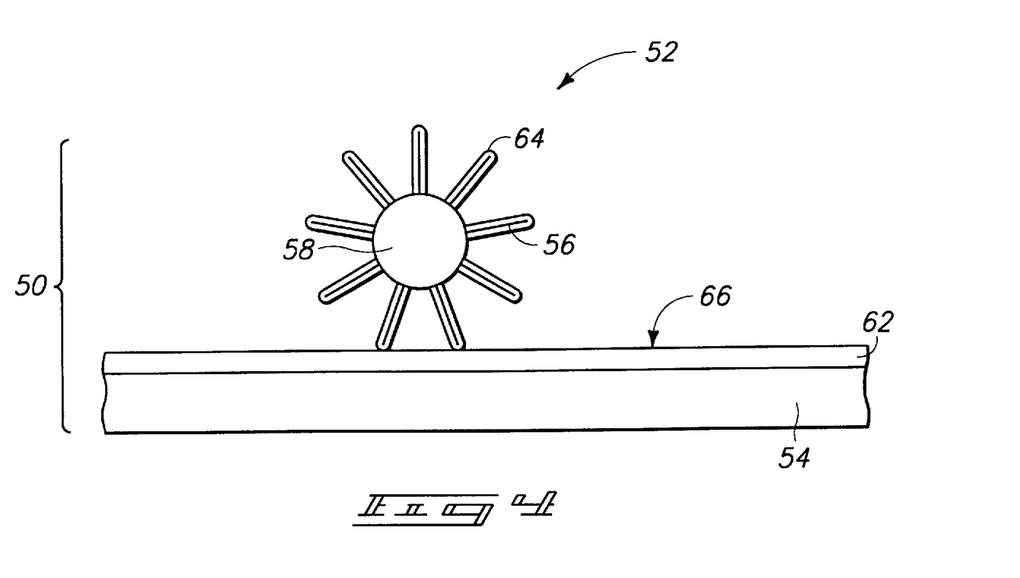
FIG. 4 is a view of the FIG. 3 apparatus, shown at a step subsequent to that of FIG. 3, and shown having a substrate proximate the apparatus.
Figure 5:
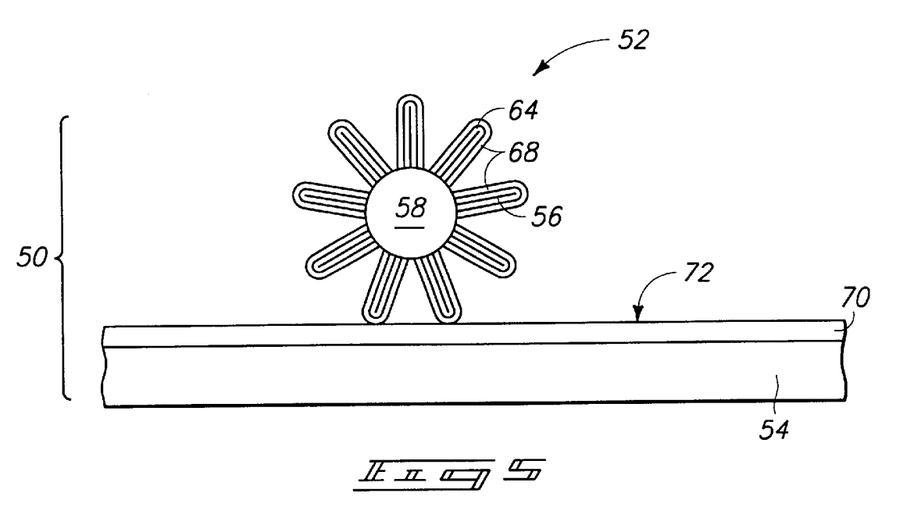
FIG. 5 is a view of the FIG. 3 apparatus shown at a step subsequent to that of FIG. 4.

Referring to FIG. 4, a substrate 62 is provided on holder 54 to be supported by holder 54. Additionally, a layer of frozen material 64 is formed over bristles 56, and cleaning member 52 is subsequently positioned proximate substrate 62 such that frozen material 64 contacts a surface 66 of substrate 62. In operation, rotatable member 58 is rotated to spin bristles 56 relative to surface 66 and accordingly to brush surface 66 with frozen material 64. Contaminants on surface 66 are displaced by the mechanical action of frozen material 64, resulting in cleaning of surface 66.

Frozen material 64 can comprise, for example, $H_2O$ or $CO_2$, or can consist essentially of, for example, $H_2O$ or $CO_2$. Frozen material 64 can be formed by providing a liquid over bristles 56 and subsequently cooling bristles 56 to a temperature below the freezing temperature of the liquid. In one aspect, frozen material 64 can be formed on bristles 56 by providing a liquid material over substrate surface 66 (i.e., between the substrate surface and the bristles), cooling the bristles to below a freezing temperature of the liquid, and rotating the bristles to freeze the material onto the bristles.

After surface 66 is cleaned, frozen material 64 can be removed from bristles 56 by melting or subliming material 64, or alternatively by scraping material 64 from bristles 56. In applications wherein material 64 is scraped from bristles 56, the material can be subsequently melted. Once material 64 is melted, whether directly melted from bristles 56 or scraped from bristles 56 and subsequently melted, such material can be subjected to a purification process, such as, for example, distillation or filtration, to remove contaminants from the melted material. The purified material can then be re-frozen on a cleaning member and utilized again in a process such as that described with reference to FIG. 4. Accordingly, in one aspect of the invention, frozen material 64 is utilized to clean a surface of substrate 62 and is subsequently converted from a solid phase to another state of matter. Such other state of matter can comprise, for example, a liquid, which is subsequently purified and then converted back to the solid phase to be utilized for cleaning a surface of another substrate.

It is noted that substrate 62 can comprise, for example, a semiconductive material wafer fragment, such as, for example, a monocrystalline silicon wafer. It is also noted that a process of the type described with reference to FIG. 4 can be utilized to clean a wafer after previous processing steps that form particulates on the wafer. An exemplary process which would form particulates on the wafer is chemical-mechanical polishing. Accordingly, a process of the present invention can be utilized to clean a semiconductive material wafer after the wafer has been subjected to chemical-mechanical polishing conditions. Further, in applications in which the methodology described with reference to FIGS. 3 and 4 is utilized to clean a plurality of substrates, each of the substrates that is cleaned can be subjected to chemical-mechanical polishing conditions before the cleaning.

A further aspect of the embodiment described with reference to FIGS. 3 and 4 is described with reference to FIG. 5. Specifically, FIG. 5 shows that a second frozen material layer 68 can be formed over first frozen material layer 64. Second layer 68 can comprise the same material as first layer 64, or can comprise a different material. An advantage of forming second frozen material layer 68 over first frozen material layer 64 is that such can form a clean surface over first frozen material layer 64 after the first frozen material layer 64 has been utilized for cleaning a substrate. More specifically, it is recognized that first frozen material layer 64 can become contaminated when cleaning a substrate. Such contaminated first frozen material layer 64 can be undesirable for use in cleaning subsequent substrates, in that the contamination on first frozen material layer 64 can be transferred to such substrates during a cleaning process. One method of addressing such problem is to simply remove material 64 and form a new frozen material over bristles 56. FIG. 5 illustrates an alternative method of addressing the problem wherein a second frozen layer 68 is formed over first frozen layer 64, with second frozen material layer 68 effectively forming a clean surface over the surface of first frozen material layer 64. FIG. 5 also shows a second substrate 70 held by substrate holder 54. Second substrate 70 has a surface 72 which contacts second frozen material layer 68, and which can be cleaned with treatment apparatus 52 by spinning bristles 56 relative to surface 72.

Frozen material 68 can be formed by providing a liquid over first frozen material 64 while cooling first frozen material 64 to a temperature below the freezing temperature of the liquid.

In particular aspects of the invention, a plurality of substrates can be cleaned with first frozen material 64, before provision of second frozen material 68. For instance, apparatus 50 can be configured to clean a set of five substrates with first frozen material 64. Subsequently, second frozen material 68 can be provided over first frozen material 64 and apparatus 50 utilized to clean another set of five substrates. Accordingly, frozen material is provided over bristles 56 at periodic intervals during treatment of a plurality of substrates. Further, at specific periods of the cleaning of the substrates, the frozen materials formed over bristles 56 can be melted from the bristles, and replaced with a new starting frozen layer, and the process repeated. In the exemplary application described above wherein a new frozen layer is formed at a period corresponding to the treatment of five substrates, an entirety of the frozen layers formed over bristles 56 could be melted from the bristles after every 25 wafers, and a fresh buildup of frozen materials initiated over the bristles. Further, the frozen materials removed from the bristles could be melted and purified, and subsequently re-frozen on the bristles.

Although the treating member 52 described above with reference to FIGS. 3–5 is described as a brush, it is to be understood that such treating member could comprise other forms, such as, for example, a pad. Preferably, the frozen materials described above with reference to FIGS. 3–5 are formed at portions of the treating member which contact a surface of a substrate which is to be cleaned. Accordingly, if the treating member is a pad, the frozen materials will be probably be formed at a surface of the pad which enables the frozen materials to contact a surface which is to be cleaned.

In further aspects of the invention described above with reference to FIGS. 3–5, the frozen materials formed over the bristles of cleaning member 52 can be at least partially melted as such bristles are moved relative to a substrate. In such applications, the frozen material undergoes a phase-change from a frozen state of matter to a liquid state of matter during a cleaning process. Such can be advantageous for flushing contaminants from a surface of a substrate during cleaning with the cleaning member 52.

Although the removal of frozen material from over cleaning member 52 is described with reference to FIGS. 3–5 as comprising melting or scraping on the material, it is to be understood that in other embodiments the frozen material can be removed by subliming the material. In such other embodiments, contaminants released from the sublimed material can be collected prior to utilizing cleaning member 52 on subsequent substrates.

Figure 6:
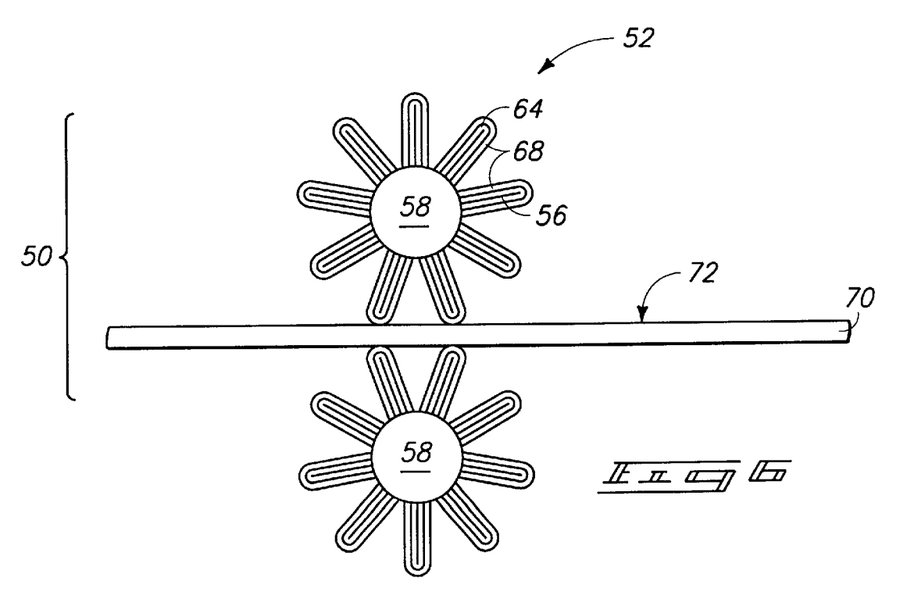
FIG. 6 is a diagrammatic view of yet another substrate surface treatment apparatus encompassed by the present invention.

The embodiment described with reference to FIGS. 3–5 utilized a cleaning member 52 to cleaning only one of two opposing surfaces of substrate 70. FIG. 6 shows an apparatus similar to that described with reference to FIGS. 3–5, but configured to clean a pair of opposing surfaces of substrate 70. The apparatus of FIG. 6 is shown at a processing step similar to that of FIG. 5, and numbering identical to that utilized in describing FIG. 5 is used for FIG. 6. A difference between the FIG. 6 apparatus and that of FIG. 5 is that substrate holder 54 (FIG. 5) is not visible in the FIG. 6 embodiment. If the substrate holder 54 of FIG. 5 were utilized in the apparatus of FIG. 6, such could block one of the cleaning members from contacting a surface of the substrate. Instead of such substrate holder, the FIG. 6 apparatus can utilize, for example, a substrate holder that retains substrate 70 at its edges (not shown).

Another embodiment of the present invention is described with reference to FIG. 7, wherein a cleaning apparatus 100 is illustrated. Cleaning apparatus 100 comprises a substrate holder 102, which is illustrated holding a substrate 104. Substrate 104 can comprise, for example, a semiconductive material wafer, such as, for example, a wafer of monocrystalline silicon.

Apparatus 100 further comprises a liquid/solid ejection system 110. System 110 comprises a first tube 112 having an inlet 114 and an outlet 116. A liquid 118 is flowed into tube 110 through inlet 114, and out of tube 110 through outlet 116. Outlet 116 is smaller than inlet 118. Accordingly, liquid flows out of outlet 116 at a greater pressure than it flows into inlet 114. The higher pressure liquid is ejected onto a surface 105 of substrate 104 to clean such surface.

Device 110 further comprises a second tube 120 having an inlet 122 and an outlet 124. Tube 120 flows through a chamber 126 configured to convert a liquid-state material to a solid-state material. Chamber 126 can comprise, for example, a region wherein one or both of a temperature and a pressure of a flowing liquid is changed to convert the flowing liquid to a flowing plurality of frozen particles.

A liquid 130 flows into tube 120 and through chamber 126, and is converted to solid particles 132. Solid particles 132 are preferably relatively fine particles, and can be referred to as a "snow". Solid particles 132 are dispersed within the liquid 118 flowing through tube 112, and are accordingly ejected from outlet 116 with liquid 118.

The ejected solid particles and liquid can clean surface 105. The solid particles can provide mechanical force against substrate surface 105 which displaces contaminants from substrate surface 105, and the liquid 118 flowing across surface 105 can sweep the displaced contaminants off of the surface.

In particular applications, liquid 118 and solid particles 132 comprise $CO_2$. Accordingly, the liquid and solid convert to a gas upon warming of substrate 104 to room temperature. In other embodiments, liquid 118 and solid 132 can both comprise $H_2O$. In yet other embodiments, liquid 118 can comprise a different material than that of solid 132. For instance, liquid 118 can comprise glycol and solid 132 can comprise $H_2O$. As another example, liquid 118 can comprise water and solid 132 can comprise $CO_2$. In one aspect, liquid 118 and frozen particles 132 can be referred to as a mixture flowed out of tube 112 and across surface 105 of substrate 104.

Although frozen particles 132 are described as being formed with a chamber 126, other methods of forming frozen particles are encompassed by the present invention. For instance a method of forming the frozen particles within a liquid, instead of utilizing chamber 126, is to utilize a second liquid 130 which freezes at a higher temperature than first liquid 112. First liquid 112 is cooled to below the freezing temperature of second liquid 130, and second liquid 130 is injected directly into the cooled first liquid 112 whereupon the second liquid freezes to form particulates of frozen material. Exemplary liquids for utilization in this aspect of the invention are glycol and $H_2O$, wherein the $H_2O$ freezes at a higher temperature than does glycol.

Figure 7:
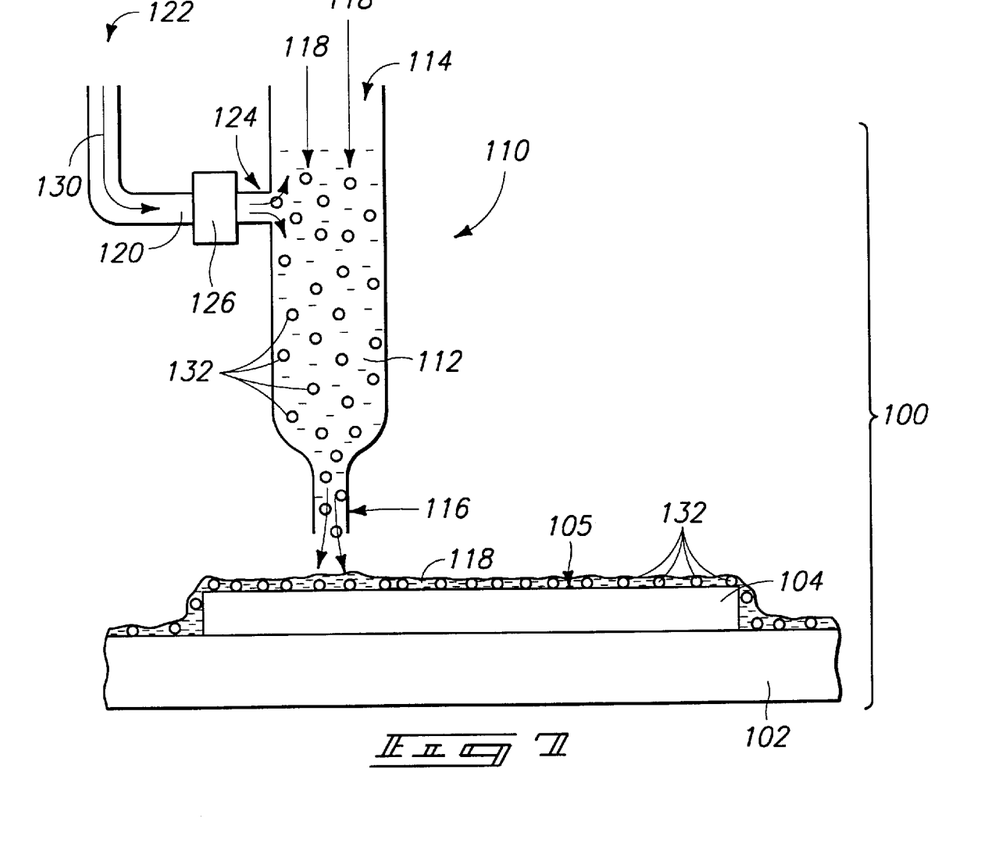
FIG. 7 is a diagrammatic view of yet another substrate surface treatment apparatus encompassed by the present invention.
Figure 8:
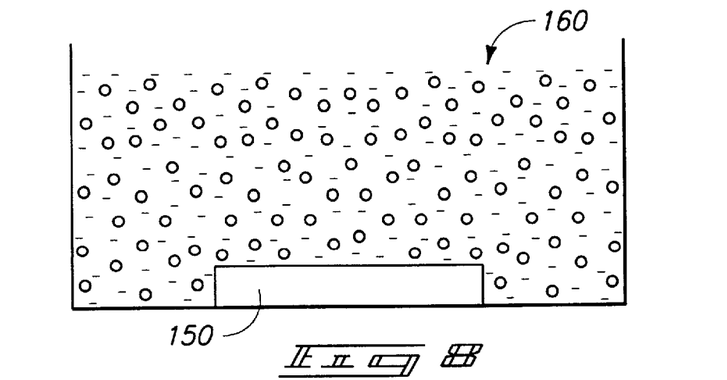
FIG. 8 is a diagrammatic view of yet another substrate surface treatment apparatus encompassed by the present invention.

The apparatus of FIG. 7 moves a mixture of frozen and liquid material relative to a substrate surface by flowing the mixture across the substrate surface. FIG. 8 illustrates an aspect of the present invention wherein a similar effect is accomplished by submerging a substrate 150 within a mixture 160 of frozen and liquid materials (the frozen and liquid materials of mixture 160 can be the same as those described above with reference to FIG. 7), and agitating the mixture. Such agitation can rub frozen material across surfaces of the substrate to clean such surfaces. Substrate 150 can comprise, for example, a semiconductive material wafer. The agitation can be accomplished by, for example, stirring the mixture and/or moving substrate 150. Although substrate 150 is shown resting on the bottom of a vessel in FIG. 8, it is to be understood that substrate 150 could be supported off of the bottom of the vessel with a holder (not shown).

It is noted that among the advantages of utilizing frozen materials for cleaning in accordance with the present invention is that surface properties of such materials can be changed with chemical or thermal modifications. Accordingly, a surface of a frozen material can be made softer, or harder, for particular applications by modifying one or both of a temperature of the frozen material surface or a chemical composition of the surface.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of treating a plurality of substrates, comprising:

providing a treating member proximate a surface of first substrate;

providing a frozen first material between a surface of the treating member and a surface of the first substrate;

after providing the frozen first material, moving the treating member relative to the surface of the first substrate;

melting the first material;

re-freezing the first material;

providing the treating member proximate a second substrate and providing the re-frozen first material between the second substrate and the treating member; and moving the treating member relative to the surface of the second substrate.

2. The method of claim 1 wherein the first and second substrates comprise monocrystalline silicon wafers, and wherein the treating of the first and second substrates occurs after subjecting the first and second substrates to chemical-mechanical polishing conditions.

3. The method of claim 1 wherein the providing the frozen first material between a surface of the treating member and a surface of the first substrate comprises freezing the first material on the surface of the treating member.

4. The method of claim 1 wherein the providing the frozen first material between a surface of the treating member and a surface of the first substrate comprises freezing the first material on the surface of the first substrate.

5. The method of claim 1 wherein the first material comprises $CO_2$.

6. The method of claim 1 wherein the first material comprises $H_2O$.

7. The method of claim 1 wherein the treating member comprises a brush.

8. The method of claim 1 wherein at least some of the first material is melted as the treating member is moved relative to the first substrate.

9. The method of claim 1 wherein at least some of the first material is melted after the frozen first material is provided between the treating member and the first substrate, and before the treating member is moved relative to the first substrate.

10. The method of claim 1 wherein at least some of the first material is melted after the treating member is moved relative to the first substrate.

11. The method of claim 1 wherein the frozen first material is filtered before it is re-frozen.

12. The method of claim 1 wherein the frozen first material is provided between the surface of the first substrate and the surface of the treating member as a slurry in a liquid first material.

13. The method of claim 1 wherein the frozen first material is provided between the surface of the first substrate and the surface of the treating member as a suspension in a liquid second material.

* * * * *

UNITED STATES PATENT AND TRADEMARK OFFICE
CERTIFICATE OF CORRECTION

PATENT NO. : 6,559,054 B2
DATED : May 6, 2003
INVENTOR(S) : Moore et al.

It is certified that error appears in the above-identified patent and that said Letters Patent is hereby corrected as shown below:

Column 1,
Line 15, please replace "faces of semiconductive mater wafers." with -- faces of semiconductive material wafers. --

Column 8,
Line 65, please replace "treating member is a pad, the frozen material will be" with -- treating member is a pad, the frozen material will --

Column 12,
Line 5, please replace "The method of claim 1 wherein the first mate rial" with -- The method of claim 1 wherein the first material --

Signed and Sealed this

Eighth Day of July, 2003

JAMES E. ROGAN
*Director of the United States Patent and Trademark Office*